US006762704B1

(12) United States Patent
Melanson et al.

(10) Patent No.: US 6,762,704 B1
(45) Date of Patent: Jul. 13, 2004

(54) MODULATION OF A DIGITAL INPUT SIGNAL USING MULTIPLE DIGITAL SIGNAL MODULATORS

(75) Inventors: John L. Melanson, Austin, TX (US); Jack B. Andersen, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/314,804

(22) Filed: Dec. 9, 2002

(51) Int. Cl.$^7$ ............................................. H03M 3/00
(52) U.S. Cl. ..................... 341/143; 341/144; 341/155
(58) Field of Search .............................. 341/143, 144, 341/155; 370/43

(56) References Cited

U.S. PATENT DOCUMENTS

| | | | | |
|---|---|---|---|---|
| 3,872,255 A | * | 3/1975 | Nance et al. | 370/436 |
| 5,084,702 A | * | 1/1992 | Ribner | 341/143 |
| 5,657,219 A | | 8/1997 | Stanley | 363/132 |
| 5,815,102 A | | 9/1998 | Melanson | 341/143 |
| 5,835,043 A | * | 11/1998 | Tsuchida et al. | 341/143 |
| 6,150,969 A | | 11/2000 | Melanson | 341/143 |
| 6,373,336 B1 | | 4/2002 | Anderskouv et al. | 330/10 |
| 6,535,154 B1 | * | 3/2003 | Sculley | 341/143 |

OTHER PUBLICATIONS

Melanson et al., "Modulation or a digital input signal using a digital signal modulator and signal splitting", filed on Dec. 20, 2002.*
Stanley, Gerald R. and Bradshaw, Kenneth M., "Precision DC–to–DC Power Conversion by Optimization of the Output Current Waveform—The Half Bridge Revisited," IEEE Transactions on Power Electronics, vol. 14, No. 2, Mar. 1999, pp. 372–380.

"Delta Sigma A/D Conversion Technique Overview," Crystal Semiconductor Corporation, Jan. 1997, AN10REV2, pp. 1–10.
Varona, Jorge, "Power Digital–to–Analog Conversion Using Sigma–Delta and Pulse Width Modulations," ECE University of Toronto, ECE1371 Analog Electronics II, pp. 1–14 (no date).
www.crownaudio.com, BCA Operation, Behind the Scenes of the . . . Balanced Current Amplifier, Aug. 23, 2002, pp. 1–8.
www.crownaudio.com, Reinventing the Power Amplifier—BCA, Jul. 16, 2002, pp. 1–3 (no date).

* cited by examiner

Primary Examiner—Jean Bruner Jeanglaude
(74) Attorney, Agent, or Firm—Hamilton & Terrile, LLP; Kent B. Chambers

(57) ABSTRACT

A digital input signal is modulated using multiple digital signal modulators operating at a variety of clock frequencies and clock frequency phase relationships to drive a load, such as an opposed current amplifier or other opposed current converter. The combinations of frequency relationships and digital signal modulator elements provide significant digital signal processing capabilities and flexible output signal timing. In one embodiment, a digital input signal, which may be biased, is modulated by multiple digital signal modulators to generate corresponding output signals. The corresponding output signals are utilized to drive a load, such as a half bridge, opposed current amplifier and to produce a single output signal. By adjusting the phase relationships between the clock frequencies, various output signal characteristics are achieved. Additionally, by utilizing digital signal processing to modulate the input signal, various processing technologies are applied to the input signal. For example, noise shaping may be implemented using delta-sigma modulators as one stage in digital signal modulators.

39 Claims, 14 Drawing Sheets

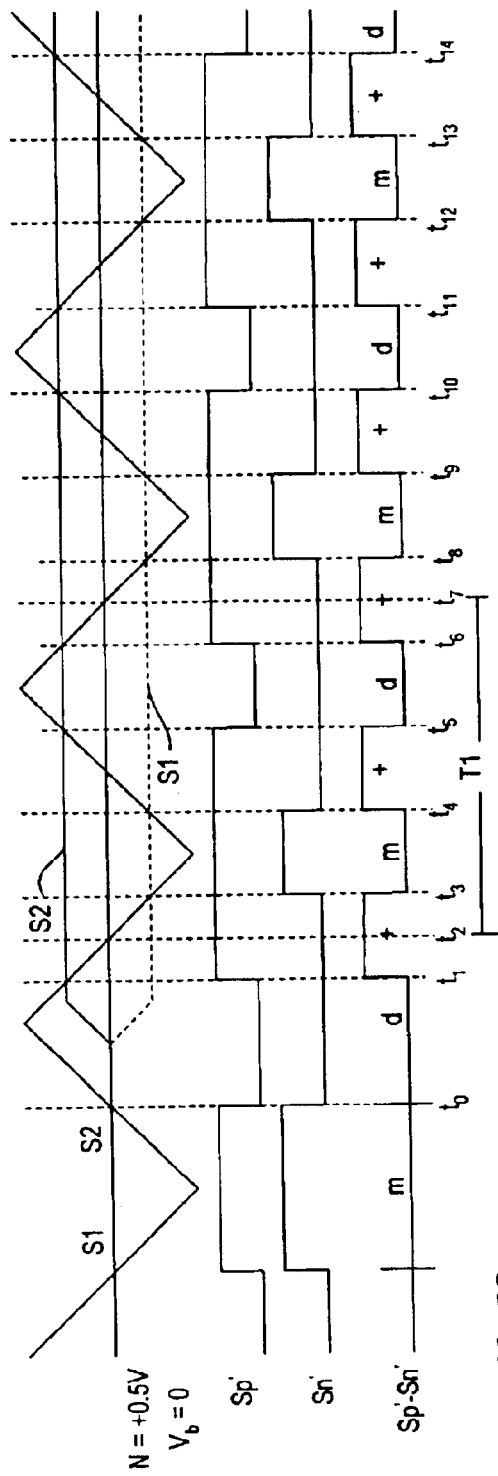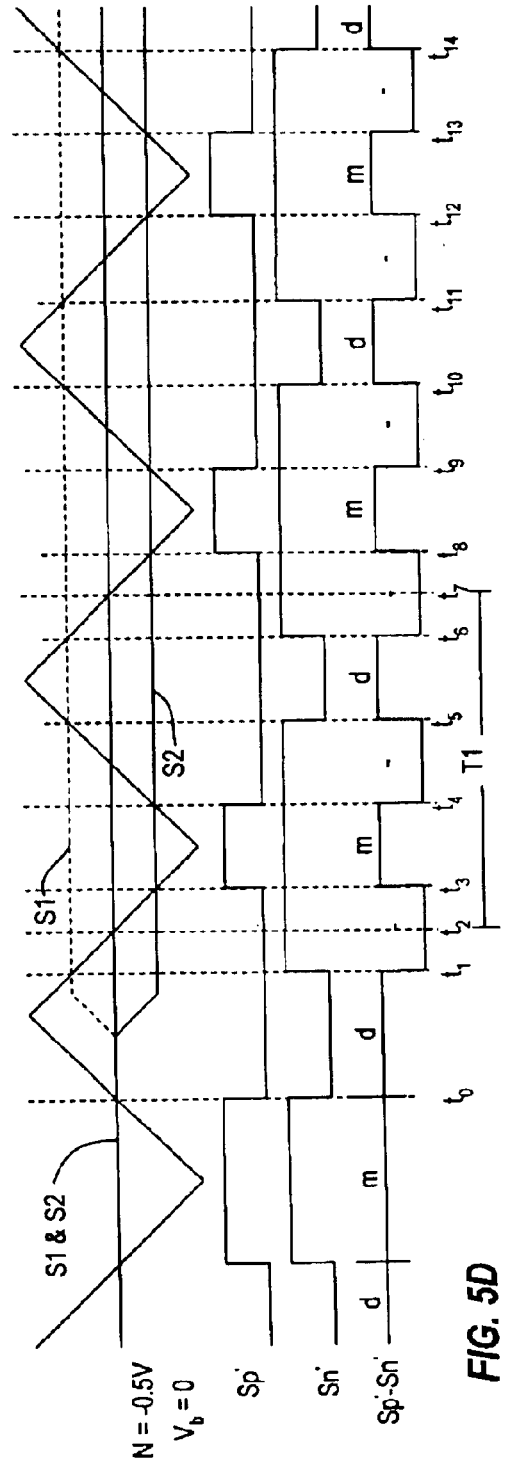

MODULATION OF A DIGITAL INPUT SIGNAL USING MULTIPLE DIGITAL SIGNAL MODULATORS

BACKGROUND OF THE INVENTION

1. Field of the Invention

The present invention relates in general to the field of signal processing, and, more specifically, to a system and method for modulating an input signal with multiple digital signal modulators.

2. Description of the Related Art

Analog and digital modulators are utilized to convert analog and digital input signals into drive signals. For example, the modulators convert an input signal into discrete pulses using well-known pulse width modulation techniques. The pulses are used as drive signals. The drive signals are utilized to drive output current to a load. In an acoustic application, voice signals may be modulated to drive a load, such as audio speakers.

Power converters may be used to convert direct current (DC) to alternating current (AC) to be used as an AC power supply, or as battery chargers/dischargers, motor controls, etc. Power converters may also be used as amplifiers, both for entertainment (sound amplification) and industrial uses. Many conventional pulse width modulated (PWM) converters use a pair of switches to connect a load alternatively to DC power supplies of opposite polarity. A modulator alternately opens and closes the switches to produce a width modulated output signal that is subsequently filtered by a low pass filter before being transmitted to the load. Care must be taken to assure that both switches are not turned "on" at the same time to prevent drawing transient "shoot-through" current. Several means are used to limit or prevent such shoot-through current. For example, Current limiting inductors may be employed or "underlap" circuits may be used to create small controlled time gaps between the conduction times of the switches. Opening and closing the switches creates a generally undesirable "ripple" frequency on an output waveform generated by the conventional modulator.

Opposed current converters ("OCCs") address the problem of ripple frequency generation. U.S. Pat. No. 5,657,219 entitled "Opposed Current Power Converter" by Gerald R. Stanley (referred to herein as the "Stanley Patent") discloses an example of an OCC. Stanley and Bradshaw, *Precision DC-to-AC Power Conversion by Optimization of the Output Current Waveform—The Half bridge Revisited*, IEEE Transactions on Power Electronics, Vol. 14, No. 2, Mar. 1999 provide additional discussion. Opposed current converters ("OCCs"), which include amplifiers referred to as class-I amplifiers, opposed current amplifiers, balanced current amplifiers, and opposed current interleaved amplifiers, are particularly useful in audio applications due to their high efficiency and high signal to noise ratios in frequency bandwidths of interest.

Referring to FIG. 1, the Stanley Patent discloses a power converter circuit 100, which is also sometimes referred to as an opposed current amplifier stage and is one embodiment of an OCC. Power converter circuit 100 receives two input drive signals $S_p'$ and $S_n'$. Signals $S_p'$ and $S_n'$ are square-waves with pulse-widths that are determined by modulating an input signal.

Power converter circuit 100 has four states of operation in the continuous current mode. Signals $S_p'$ and $S_n'$ determine the states of operation by respectively controlling the conductivity of switches 102 and 104. Switches 102 and 104 conduct during the interval when $S_p'$ and $S_n'$ are both HIGH causing the main output inductor currents Ip and In to increase at a rate of approximately V/L, in which L=Lp=Ln and V is the magnitude of each supply voltage (Vsupply). When $S_p'$ and $S_n'$ are both HIGH, the magnetization of inductors Lp and Ln are increased. When $S_p'$ and $S_n'$ are both LOW, switches 102 and 104 become nonconductive, the inductor voltages are reversed, the diodes 108 and 110 conduct, and the inductor current magnitudes ramp down at the same rate. When $S_p'$ and $S_n'$ are both LOW, the magnetization of inductors Lp and Ln are decreased. When $S_p'$ is LOW and $S_n'$ is HIGH, switch 104 and diode 110 conduct resulting in negative output current (Iout) into output node 106. When $S_p'$ is HIGH and $S_n'$ is LOW, switch 102 and diode 108 conduct resulting in positive output current Iout from node 106.

Table 1 summarizes the four continuous current mode states of operation for power converter circuit 100 with reference to signals $S_p'$ and $S_n'$. Table 1 uses "HIGH" and "LOW" to represent the states of signals $S_p'$ and $S_n'$. In the embodiment of FIG. 1, a HIGH signal causes switches 102 and 104 to conduct, and a LOW signal causes switches 102 and 104 to open.

TABLE 1

| $S_p'$ | $S_n'$ | Power Converter Circuit 100 Current Mode States |
|---|---|---|
| LOW | LOW | Demagnetizing |
| LOW | HIGH | Negative Output Current |
| HIGH | LOW | Positive Output Current |
| HIGH | HIGH | Magnetizing |

Referring to FIG. 2A, the Stanley Patent describes an analog modulator 200 utilized to produce signals $S_p'$ and $S_n'$ for driving power converter circuit 100. Analog modulator 200 utilizes an error amplifier 202 to generate an error signal 204 from an input signal 206, representing a desired level at output node 106 of power converter circuit 100, and a feedback signal 208 taken from output node 106. Inverter 218 inverts error signal 204 to generate inverse error signal 216. Comparators 210 and 214 generate respective signals $S_p'$ and $S_n'$ by comparing a triangle waveform 212 with respective error signal 204 and inverse error signal 216. $S_p'$ is HIGH when the magnitude of triangle waveform 212 exceeds error signal 204, and $S_p'$ is LOW when the magnitude of error signal 204 exceeds triangle waveform 212. Likewise, $S_n'$ is HIGH when the magnitude of triangle waveform 212 exceeds inverse error signal 216, and $S_n'$ is LOW when the magnitude of inverse error signal 214 exceeds triangle waveform 212.

For example, the triangle waveform 212 is also biased to address cross-over distortion during the switching of switches 102 and 104. Triangle waveform generator 220 generates triangle waveform 212 from a square wave input signal 222. The direct current (DC) level of the triangle waveform 212 is adjusted by adding or subtracting bias signal 224 from triangle waveform 212. The bias is normally adjusted such that, at input signal equal zero, both switches are on slightly more than 50% of the time, and an idle current exists in the inductors Ln and Lp, which keeps the diodes 108 and 110 clamped during the de-magnetization phase.

Referring to FIG. 2B, U.S. Pat. No. 6,373,336, entitled *Method of Attenuating Zero Crossing Distortion and Noise*

*in an Amplifier, an Amplifier and Uses of the Method and the Amplifier*, inventors Niels Anderskouv and Lars Risbo, (referred to herein as the "Anderskouv-Risbo Patent") describes an example of using dual pulse width modulators, PWM A and B, to drive respective half bridge amplifiers A and B connected to load 258. A signal source 252 provides an input signal to inverting block 254 and noninverting block 256. PWM A provides one output signal to drive the switches of Half bridge A, and PWM B provides one output signal to drive the switches of Half bridge B. The Anderskouv-Risbo Patent introduces a delay element ΔT into the signal path between PWM B and half bridge B to prevent simultaneous switching of switches on the half bridges A and B and, thus, attenuate cross-over distortion. The Anderskouv-Risbo Patent does not teach providing appropriate signals to drive switches separately within a half bridge amplifier such as power converter circuit 100. In contrast, the Stanley patent teaches switching techniques for use within a half bridge. Two copies of the Stanley circuit could be used for creating a full bridge circuit.

For example, the Stanley Patent, the Anderskouv-Risbo Patent, and others do not address the application of digital signal processing technology to provide appropriate input signals to loads such as power converter circuit 100.

SUMMARY OF THE INVENTION

In some embodiments of the present invention, a digital input signal is modulated using multiple digital signal modulators operating at a variety of clock frequencies and clock frequency phase relationships to drive a load, such as an OCC. The combinations of frequency relationships and digital signal modulator elements provide significant digital signal processing capabilities and flexible output signal timing.

In one embodiment of the present invention, an apparatus includes a first digital signal modulator to generate a first output signal derived from a digital input signal and a second digital signal modulator to generate a second output signal derived from the digital input signal. The first and second digital signal modulators are operable to process digital signals in one embodiment and mixed analog and digital signals in another embodiment. Pairs of delta-sigma modulators and pulse width modulators form the first and second digital signal modulators in one embodiment. The first output signal has a direct relationship to change in the digital input signal, and the second output signal has an inverse relationship to change in the digital input signal. The first and second output signals are suitable for driving an OCC stage such as a half bridge, opposed current amplifier.

In another embodiment of the present invention, a method of providing multiple output drive signals derived from a common input signal using multiple modulators includes receiving a first digital input signal, the first digital input signal being derived from a common input signal and a first bias signal. In one embodiment, the common input signal is a digital audio signal, and the first digital input signal is derived by summing the common input signal and the first bias signal. The method further includes converting the first digital input signal into a first output signal using a first modulator. The method also includes receiving a second digital input signal, the second digital input signal being derived from the common input signal and a second bias signal and converting the second digital input signal into a second output signal using a second modulator. The method includes providing the first and second output signal to circuitry for deriving a drive signal from the first and second output signals. In one embodiment, the drive signal is derived by using the first and second output signals to generate the drive signal of an amplifier, such as an opposed current converter.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 5A, 5B, 5C, and 5D depict examples of input and output signals from the digital signal processing system of FIG. 4 for various input and bias signal levels.

DETAILED DESCRIPTION

Signals may be generally processed through utilizing digital signal processing technology and mixed signal (analog and digital) technology. For example, audio signals are often digitized, processed, and converted back into analog signals to produce sound through a loud speaker. Amplifiers utilizing multiple drive signal inputs, such as OCCs, are particularly useful for audio applications due to their low noise output when receiving an audio input signal at a zero or near zero level (representing silence or low volume audio input).

The signal processing systems disclosed herein include multiple digital signal modulators capable of receiving a digital input signal, such as an audio digital signal, and providing multiple, modulated output signals. The signal processing systems are in some embodiments characterized as a digital to analog converter system when the output signals are utilized to drive loads, such as OCCs, and the loads provide an analog representation of a digital input signal. Additionally, digital signal processing affords opportunities for implementing digital signal processing techniques, such as noise shaping.

Figure 3:
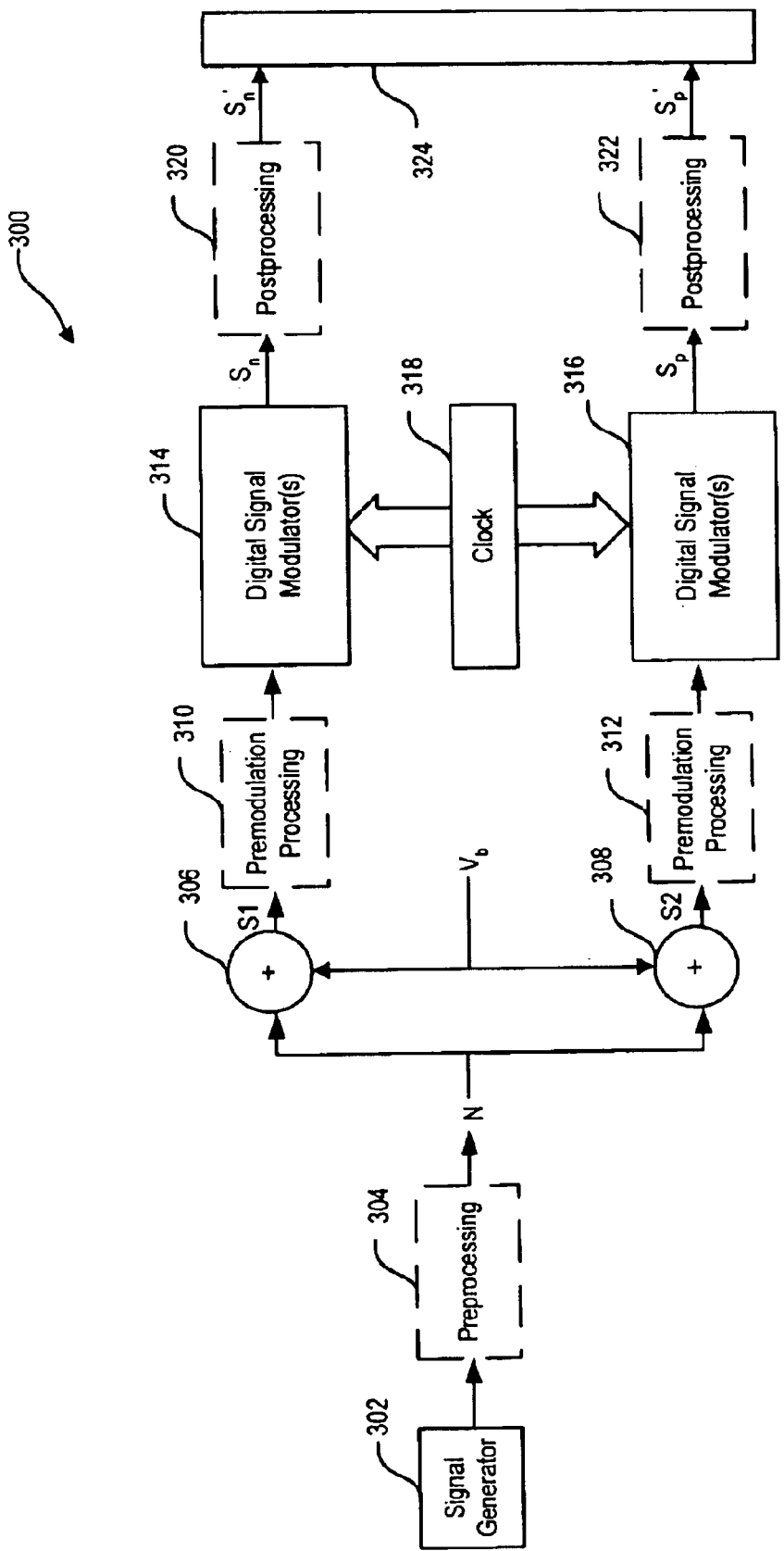
FIG. 3 depicts a digital signal processing system for providing multiple modulated signals derived from a single input signal.

FIG. 3 depicts digital signal processing system 300 having a signal generator 302, which is, for example, a microphone capable of producing an electronic signal in response to audio sound waves and analog to digital sampling technology to convert the microphone output signal into a digital signal. The digital signal processing system 300 also generally includes well-known signal preprocessing components 304, such as a register, low pass filter, and linear interpolator. U.S. Pat. No. 5,815,102, entitled *Delta Sigma PWMDAC to Reduce Switching*, inventor John L. Melanson, (referred to herein as the "Melanson Patent") describes examples of such preprocessing components in the text referencing FIG. 4 in the Melanson Patent. The Melanson Patent is hereby incorporated by reference in its entirety. Preprocessing components 304 produce an input signal N. The digital signal processing system 300 utilizes summers 306 and 308 to modify input signal N with bias signal $V_b$. Depending on the embodiment, digital signal processing system 300 may complement signal N and/or bias signal $V_b$ to generate output signals S1 and S2. Switches in amplifiers, such as the power converter circuit 100, transition between open and close to control the power supplied by the amplifier. Well-known nonlinearities, such as zero current, crossover distortion, in output current Iout occur due to the timing of switching cycles. Bias signal $V_b$ is generally set in a range that is high enough to minimize such nonlinearities and low enough to minimize voltage swing reductions.

Signals S1 and S2 are further processed by respective premodulation components 310 and 312 prior to being modulated by respective digital signal modulator(s) 314 and 315. Premodulation components 310 and 312 include well-known linear interpolators to increase the sample rate of signals S1 and S2.

The digital signal modulators 314 and 316 modulate the signals S1 and S2 to generate respective signals $S_n$ and $S_p$. In addition to converting signals S1 and S2 into signals appropriate to drive a selected load, digital signal modulators 314 and 316, in some embodiments, utilize technology to further process signals S1 and S2 as desired. For example, digital signal modulators 314 and 316 implement noise-shaping technology to shift noise frequencies in signals S1 and S2 out of preselected bandwidths. For example, for audio applications, digital signal modulators 314 and 316 shift noise in signals S1 and S2 into frequencies outside of human perceptible audio frequencies (i.e., generally above 20 kHz). In this way, the digital implementation of digital signal processing system 300 differs markedly from the analog implementation of the Stanley Patent. In the digital implementation of digital signal processing system 300, the output of all pulse widths are not possible. The widths are generally quantized by the highest available clock frequency. The highest available resolution is generally insufficient for high quality audio. Noise shaping techniques are then utilized to bring the audio performance to a higher level. These problems differ greatly from the analog, continuous time case, in which noise shaping due to quantization is not necessary, as any possible width can theoretically be utilized.

Clock 318 provides the clock signals used by digital signal processing system 300. Clock 318 may be implemented as one or more clocks and may provide a variety of clock signals to digital signal modulators 314 and 316 for use by multiple components. As discussed in more detail below, the clock signals provided to digital signal modulator(s) 314 may be in-phase with the clock signals provided to digital signal modulator(s) 316.

Signals $S_n$ and $S_p$ are processed following digital modulation by optional postprocessing components 320 and 322 to generate signals $S_n'$ and $S_p'$. Postprocessing components 320 and 322 include well-known components, such as level shifters and delay elements. Signals $S_n'$ and $S_p'$ drive load 324. Load 324 may be an OCC, such as power converter circuit 100.

The digital signal processing system 300 is implemented in a variety of ways. Several embodiments of digital signal processing system 300 are discussed below.

Figure 4:
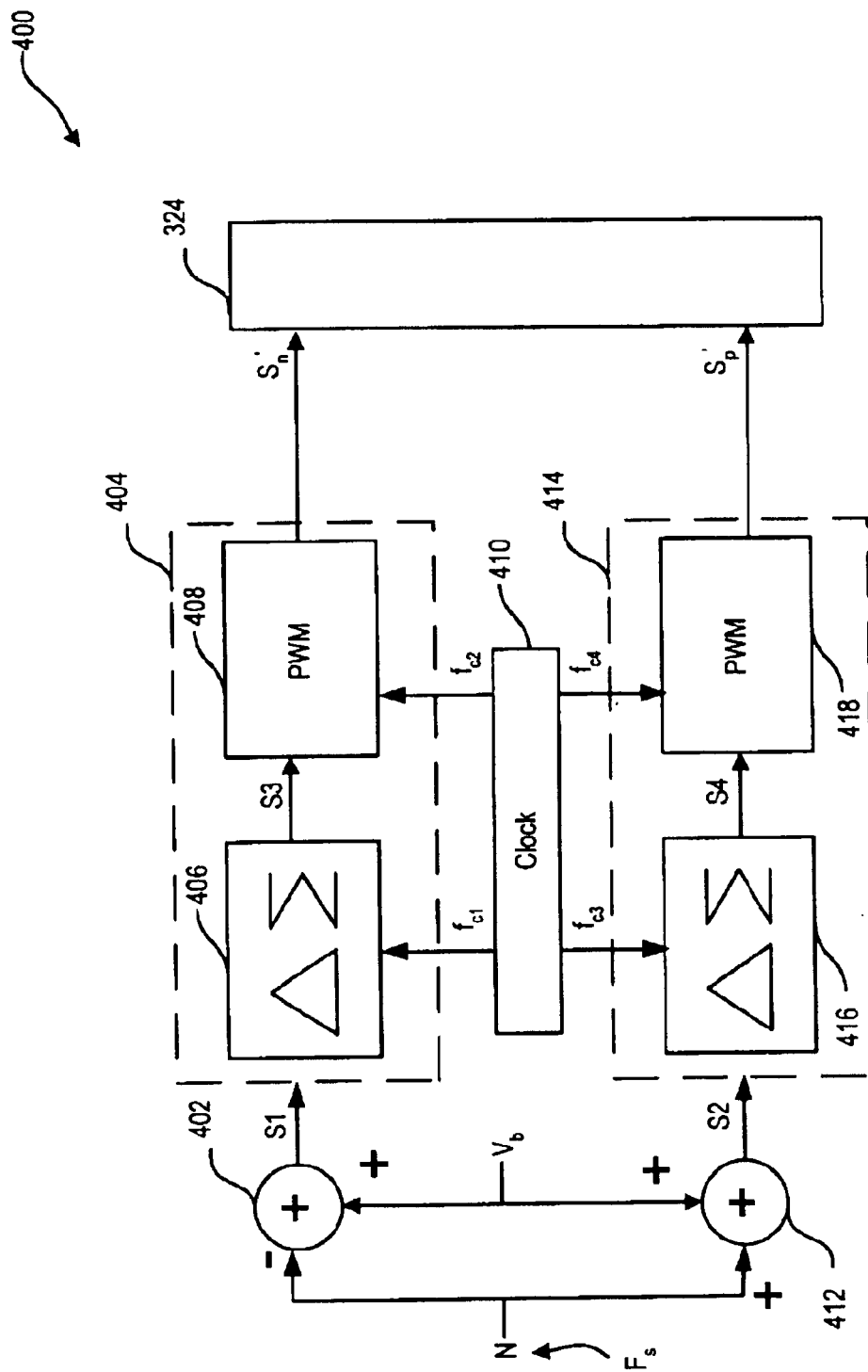
FIG. 4 depicts one embodiment of the digital signal processing system of FIG. 3.

FIG. 4 depicts digital signal processing system 400, which is one embodiment of digital signal processing system 300. The digital signal processing system 400 derives signals $S_n'$ and $S_p'$ from input signal N and a bias signal $V_b$. Optional pre- and post-processing components are not shown for clarity but may be included in all the digital signal processing system embodiments disclosed herein. Input signal N is a digital signal sampled at frequency $f_s$ and, in one embodiment, is a 24 bit audio signal. As described above, input signal N is generally an interpolated version of a digital audio input signal. For high quality audio, a typical value for $f_s$ would be 384 kHz, or 8 times the standard 48 kHz sample rate. Summer 402 adds the complement of signal N to bias signal $V_b$ to generate signal S1. (Note: As used herein, the complement of a signal may also be referred to as the inverse of the signal.)

Digital signal modulator 404 could directly modulate signal S1 into drive signal $S_n'$ using a modulator appropriate for the topology of load 324, such as pulse width modulator (PWM) 408 alone. However, digital signal modulator 404 includes delta-sigma modulator 406 to, for example, provide the noise shaping properties of delta-sigma modulators, which are particularly useful for audio frequency signals. Clock 410 provides a clock signal frequency, $f_{c1}$, to the delta-sigma modulator 406 and modulates signal S1 into a series of multi-bit output signals S3. In this example, $f_{c1}=f_s=384$ kHz. PWM 408 in turn modulates signals S3 to produce one-bit drive signal $S_n'$. Clock 410 provides a clock signal frequency, $f_{c2}$, to PWM 408 giving $S_n'$ a resolution of $f_{c2}/f_{c1}$. A typical value of $f_{c2}$ would be 49.152 MHz, giving a $f_{c2}/f_{c1}$ ratio of 128. As discussed in more detail with reference to FIG. 5, input signal N and the duty cycle of signal $S_n'$ are inversely proportional, i.e. as the magnitude of input signal N decreases, the pulse width of signal $S_n'$ increases and vice versa. (Note: delta-sigma modulators are also often referred to as sigma-delta modulators.)

In the same manner that digital signal modulator 404 processes signals S1 and S3 to generate signal $S_n'$, digital signal modulator 414 utilizes delta-sigma modulator 416 and PWM 418 to modulate respective signals S2 and S4 and generate signal $S_p'$. Summer 412 generates signal S2 by adding input signal N to bias signal $V_b$. Clock 410 provides an $f_{c3}$ frequency clock signal to delta-sigma modulator 416 and an $f_{c4}$ frequency clock signal to PWM 418. As discussed in more detail with reference to FIG. 5, input signal N and signal $S_p'$ are directly proportional, i.e. as the magnitude of input signal N increases, the pulse width of signal $S_p'$ increases and vice versa.

An example embodiment of digital signal modulators 404 and 414 is described in the Melanson Patent U.S. Pat. No. 5,784,017, entitled *Analogue and Digital Convertors Using Pulse Edge Modulators with Non-linearity Error Correction*, inventor Peter Craven, (referred to herein as the "Craven Patent") describes an example of pulse width modulation technology and error correction. In another embodiment of digital signal processing system 400, PWMs 408 and 418 are implemented by the pulse width modulation technology of the Craven Patent. The Craven Patent is hereby incorporated by reference in its entirety.

Figure 1:
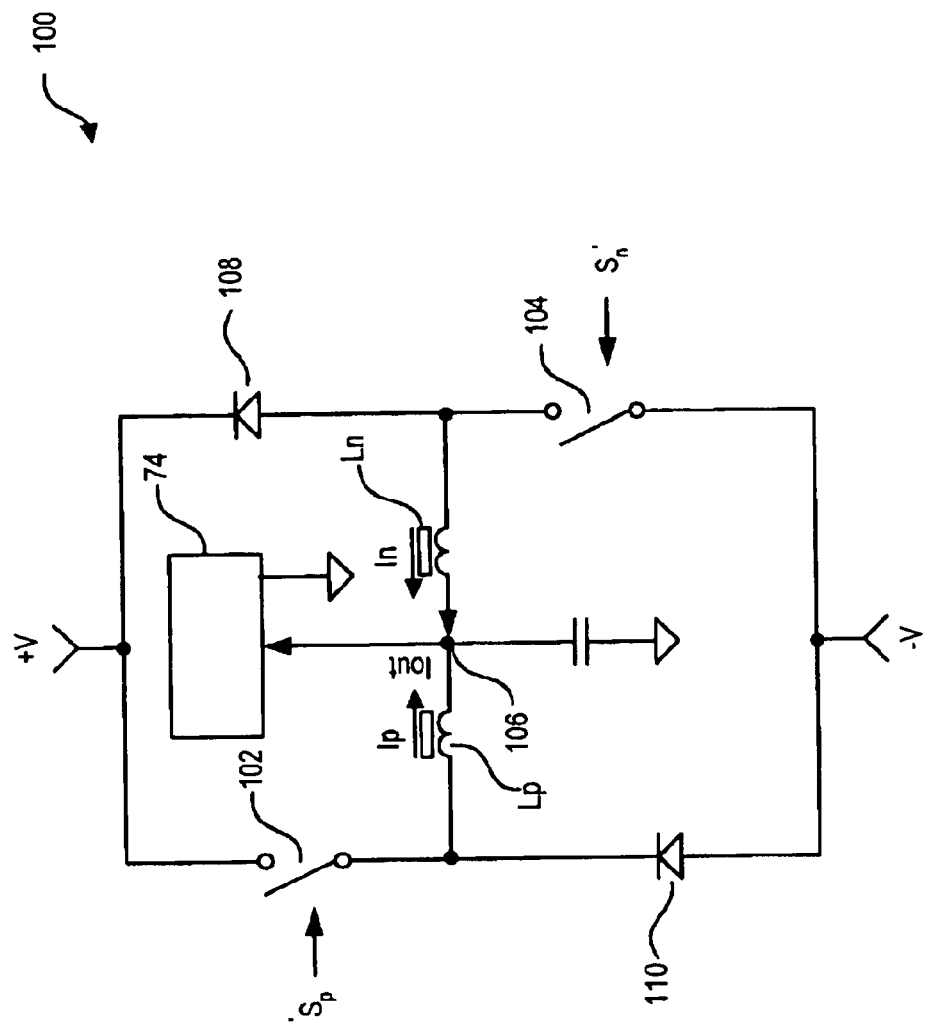
FIG. 1 (prior art) depicts an embodiment of an opposed current amplifier.
Figure 2A:
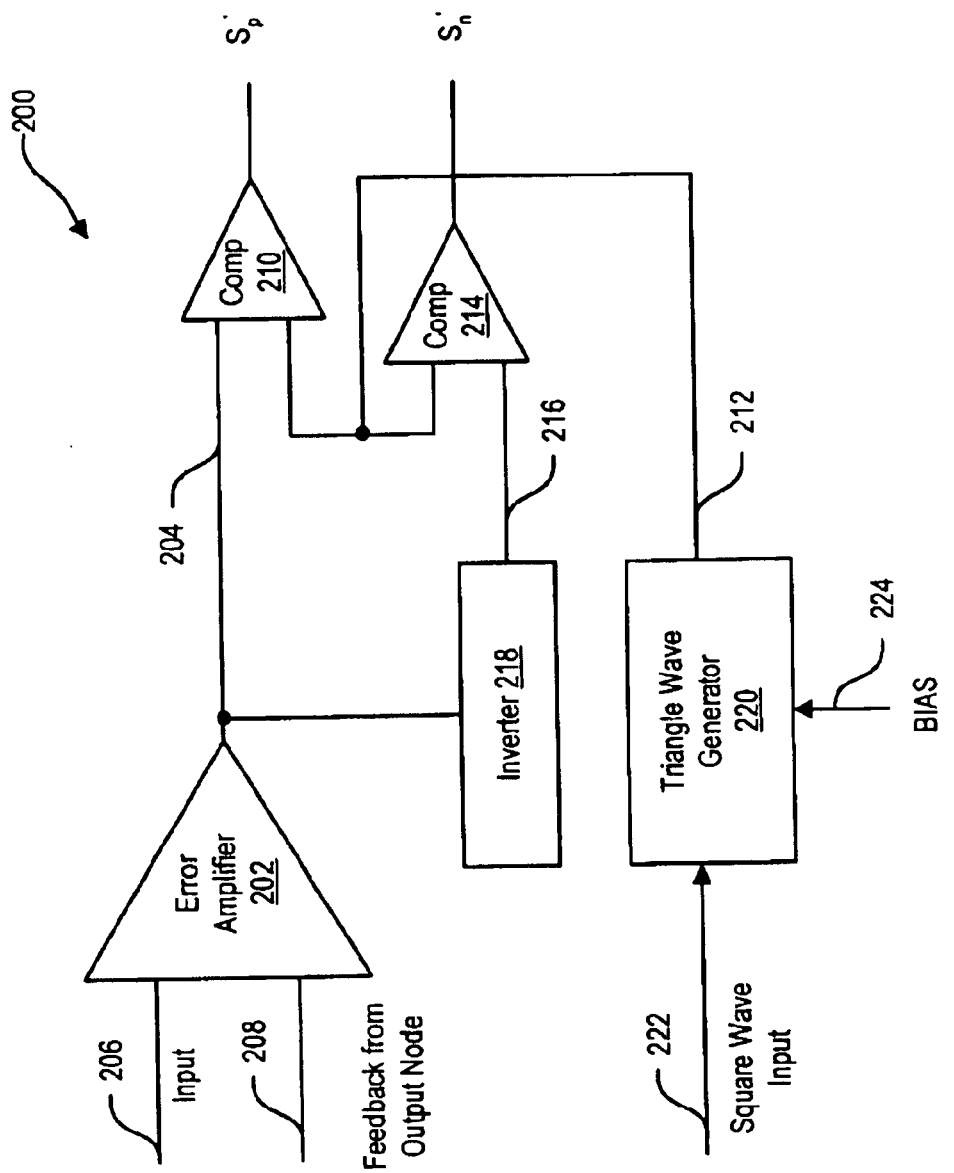
FIG. 2A (prior art) depicts a modulator for providing drive signals to the opposed current amplifier of FIG. 1.
Figure 2B:
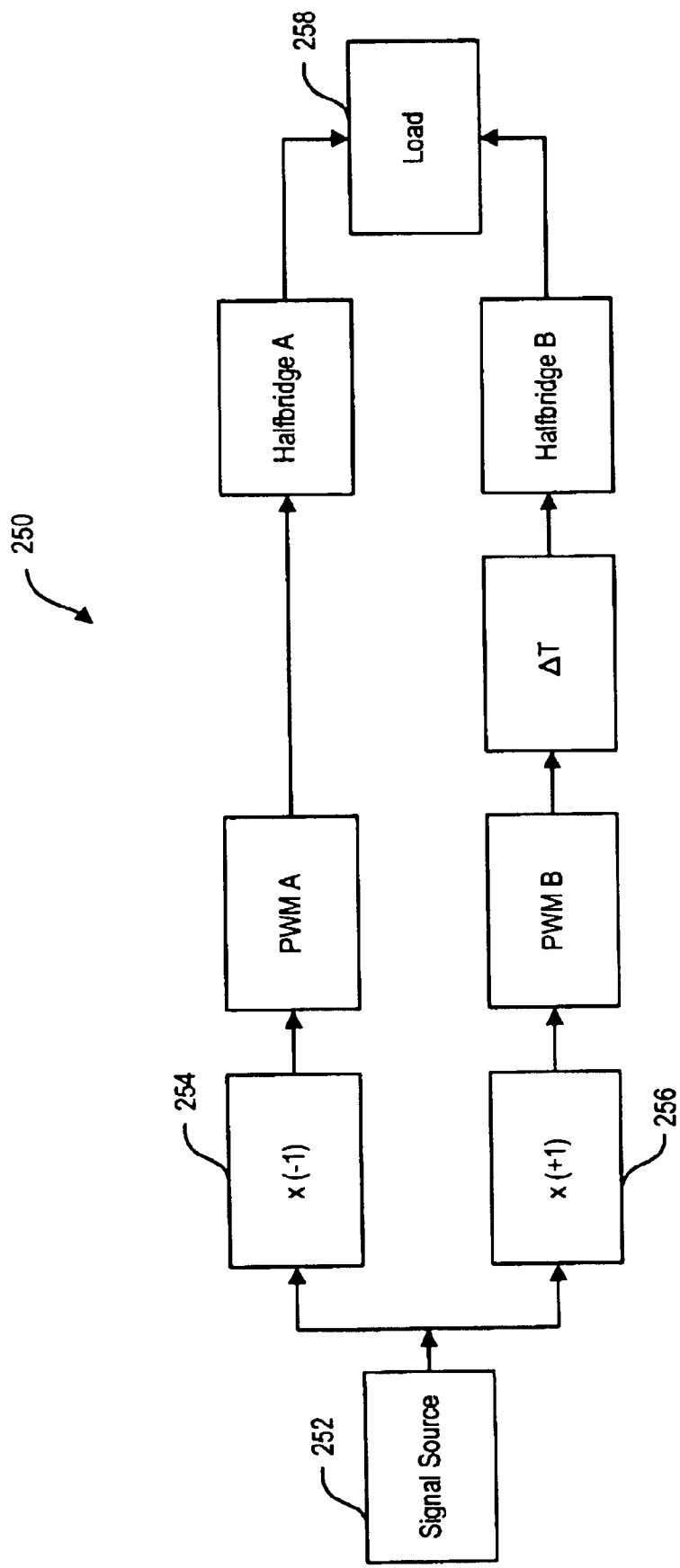
FIG. 2B (prior art) depicts a pair of modulators for providing signals to respective half bridge amplifiers.

Although digital signal processing system 400 may be used in many different applications, in one embodiment, it is used to modulate an audio signal. Accordingly, Table 2 summarizes example sampling and clock frequencies useful for audio applications (all of the frequencies having the same phase). One advantage of using frequencies with the same phase relationships is the confinement of $S_p'-S_n'$ LOW or HIGH transitions and, thus, Iout (FIG. 1) transitions to a single period.

TABLE 2

| Frequency Variable | Value |
| --- | --- |
| $f_s$ | 48 kHz |
| $f_{c1}$ | 384 kHz (i.e. 8 times $f_s$) |
| $f_{c2}$ | 49.152 MHz (i.e. $2^7$ times $f_{c1}$ for 7 bit resolution) |
| $f_{c3}$ | 384 kHz (i.e. 8 times $f_s$) |
| $f_{c4}$ | 49.152 MHz (i.e. $2^7$ times $f_{c3}$ for 7 bit resolution) |

In general for a load such as power converter circuit 100, the average Vout at node 106 during a period, T, is given by Vout=Vsupply*(t− minus t+)/T, where t− is the time during which $S_p'-S_n'$ is LOW (indicated by a "−" in the $S_p'-S_n'$ plot of FIG. 5), t+ is the time during which $S_p'-S_n'$ is HIGH (indicated by a "+" in the $S_p'-S_n'$ plot of FIG. 5), and T is one period of the PWMs 408 and 418. The percentage of time for magnetization current in inductors Lp and Ln is 100($t_m-t_d$)/T, in which $t_m$ is the magnetization time during which $S_n'=S_p'$=HIGH (indicated by an "m" in the $S_p'-S_n'$ plot of FIG. 5) and $t_d$ is the de-magnetization time during which $S_n'=S_p'$=LOW (indicated by a "d" in the $S_p'-S_n'$ plot of FIG. 5).

Figure 5A:
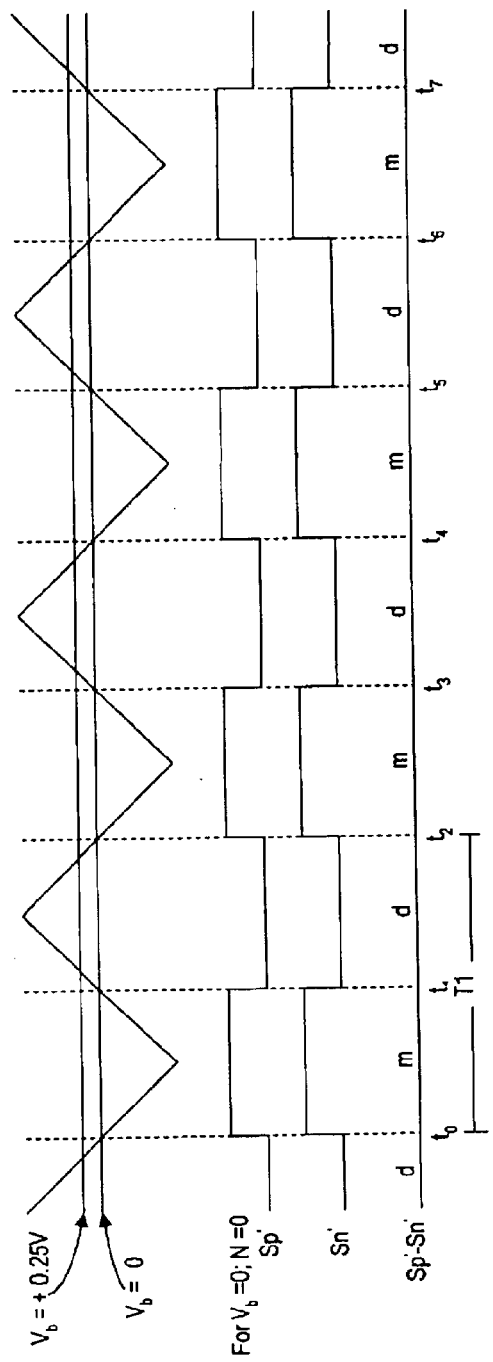
Figure 5B:
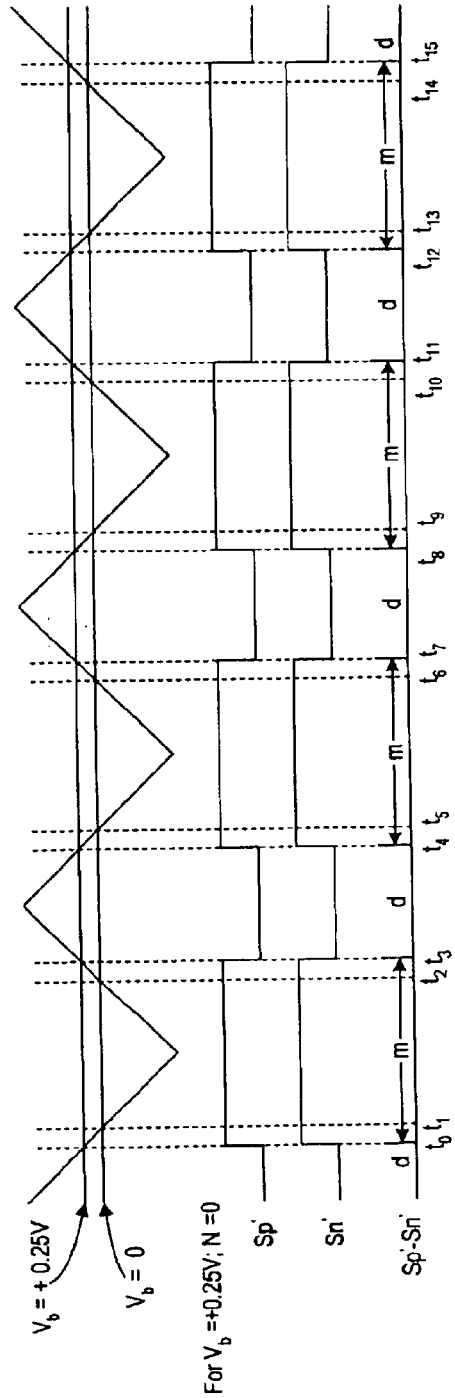

FIG. 5, consisting of FIGS. 5A, 5B, 5C, and 5D, depicts sample cycles of $S_n'$ and $S_n'$ as generated by digital signal processing system 400 in response to various levels of input signal N and bias signal $V_b$. (Note: The triangular waveforms of FIGS. 5, 7, and 8 merely illustrate the periods of PWMs and assist in identifying $S_p'$ and $S_n'$ transitions. The triangular waveforms are not physically present in the systems of FIGS. 4, 6, 9, and 10. In addition, the quantization steps due to clocks $f_{c2}$ and $f_{c4}$ are not illustrated.) Referring to FIG. 5A, the depiction of $S_p'$ minus $S_n'$ illustrates how digital signal processing system 400 processes a zero level input signal N and zero level bias signal $V_b$ to drive the four continuous current phases of power converter circuit 100 in accordance with Table 1. One period of PWMs 408 and 414 is represented by "T1". The time between to and t2 represents an example period T1 for T. During the first half of period T1, $S_p'$ and $S_n'$ are HIGH and are both LOW during the second half of period T1. Thus, at node 106, Vout_average=Vsupply*((t1−t0)−(t2−t1))=0 for N=bias signal $V_b$=0. As depicted in FIG. 5A, Vout_average remains at 0 as long as N=bias signal $V_b$=0.

FIG. 5B illustrates one embodiment of utilizing digital signal processing system 400 to generate a nonzero Vout_average at node 106 while input signal N=0. A positive bias signal $V_b$ increases the nominal pulse widths of $S_p'$ and $S_n'$. Thus, when N=0 and bias signal $V_b$ is positive, Vout_average is positive, i.e. Vout-average for T. A positive Vout_average indicates a longer magnetizing time, m, (e.g. (t3−t1)+(t5−t4)) for inductors Lp and Ln relative to the demagnetizing time, d, (e.g. t4−t3) during a period T (e.g. t5−t1). Conversely, a negative bias signal $V_b$ decreases the nominal pulse widths of $S_p'$ and $S_n'$ resulting in a negative Vout_average and a longer demagnetizing time of inductors Lp and Ln during a period T (not shown). Although FIGS. 5 and 7 depict bias signal $V_b$=+0.25V for demonstration purposes, bias signal $V_b$ is generally determined as discussed above. Again, the waveforms are illustrative, as the actual widths vary with noise shaping active.

FIG. 5C illustrates the responsiveness of digital signal processing system 400 to positive changes in input signal N and concurrence with Table 1. Between t0 and t1, input signal S2 transitions with input signal N from 0 to +0.5 V, and input signal S1, the complement of input signal N, transitions from 0 to −0.5 V. The positive change in input signal N causes digital signal modulator 404 to generate $S_n'$ with a net LOW duty cycle during each period, while input signal N is positive and bias signal $V_b$=0. Correspondingly, digital signal modulator 414 generates $S_p'$ with a net HIGH duty cycle during each such period. For example, during period T1, $S_n'$ is LOW while $S_p'$ is HIGH for 0.75*T1, i.e. between t2 and t3, t4 and t5, and t6 and t7. During the remainder of T1 (i.e. 0.25*T1), $S_n'$ and $S_p'$ are both LOW. Thus, assuming digital signal processing system 400 is driving powder converter circuit 100, Vout_average for T1=Vsupply*(0.75−0.25)=0.5 Vsupply. Thus, digital signal processing system 400 provides the appropriate levels of output signals $S_n'$ and $S_p'$ to drive load 324 to produce an output signal corresponding to the positive change in input signal N.

As a counterpart to FIG. 5C, FIG. 5D illustrates the responsiveness of digital signal processing system 400 to negative changes in input signal N and concurrence with Table 1. Between t0 and t1, input signal S2 transitions with input signal N from 0 to −0.5 V, and input signal S1, the complement of input signal N, transitions from 0 to +0.5 V. The negative change in input signal N causes digital signal modulator 404 to generate $S_n'$ with a net HIGH duty cycle during each period, while input signal N is negative and bias signal $V_b$=0. Correspondingly, digital signal modulator 414 generates $S_p'$ with a net LOW duty cycle during each such period. For example, during period T1, $S_n'$ is HIGH while $S_p'$ is LOW for 0.75*T1, i.e. between t2 and t3, t4 and t5, and t6 and t7. During the remainder of T1 (i.e. 0.25*T1), $S_n'$ and $S_p'$ are both HIGH. Thus, Vout_average for T1=Vsupply* (0.25−0.75)=−0.5 Vsupply. Thus, digital signal processing system 400 provides the appropriate levels of output signals $S_n'$ and $S_p'$ to drive load 324 to produce an output signal corresponding to the negative change in input signal N.

In one embodiment, when $S_p'$ and $S_n'$ drive respective switches 102 and 104 of power converter circuit 100, the output current Iout of power converter circuit 100 is derived from $S_p'$ and $S_n'$ and represents an amplified analog of digital signal N. Thus, digital signal processing system 400 is capable of processing input signal N to drive the four continuous current phases of power converter circuit 100 in accordance with Table 1.

The two digital signal modulators 404 and 414 of digital signal processing system 400 operate substantially in-phase. Clock frequencies and input signal N sampling frequency, $f_s$, of digital signal processing system 400 are generally chosen such that only positive or negative transitions of $S_p'-S_n'$ occur during a period T, thus minimizing load output current ripple. However, as discussed with reference to FIG. 8, digital signal modulators of digital signal processing system 300 may be operated out-of-phase (skewed in the time domain) to still process input signal N to drive the four continuous current phases in accordance with Table 1. When operating the digital signal modulators out-of-phase, positive and negative transitions of $S_p'-S_n'$ may occur during the same period.

Figure 6:
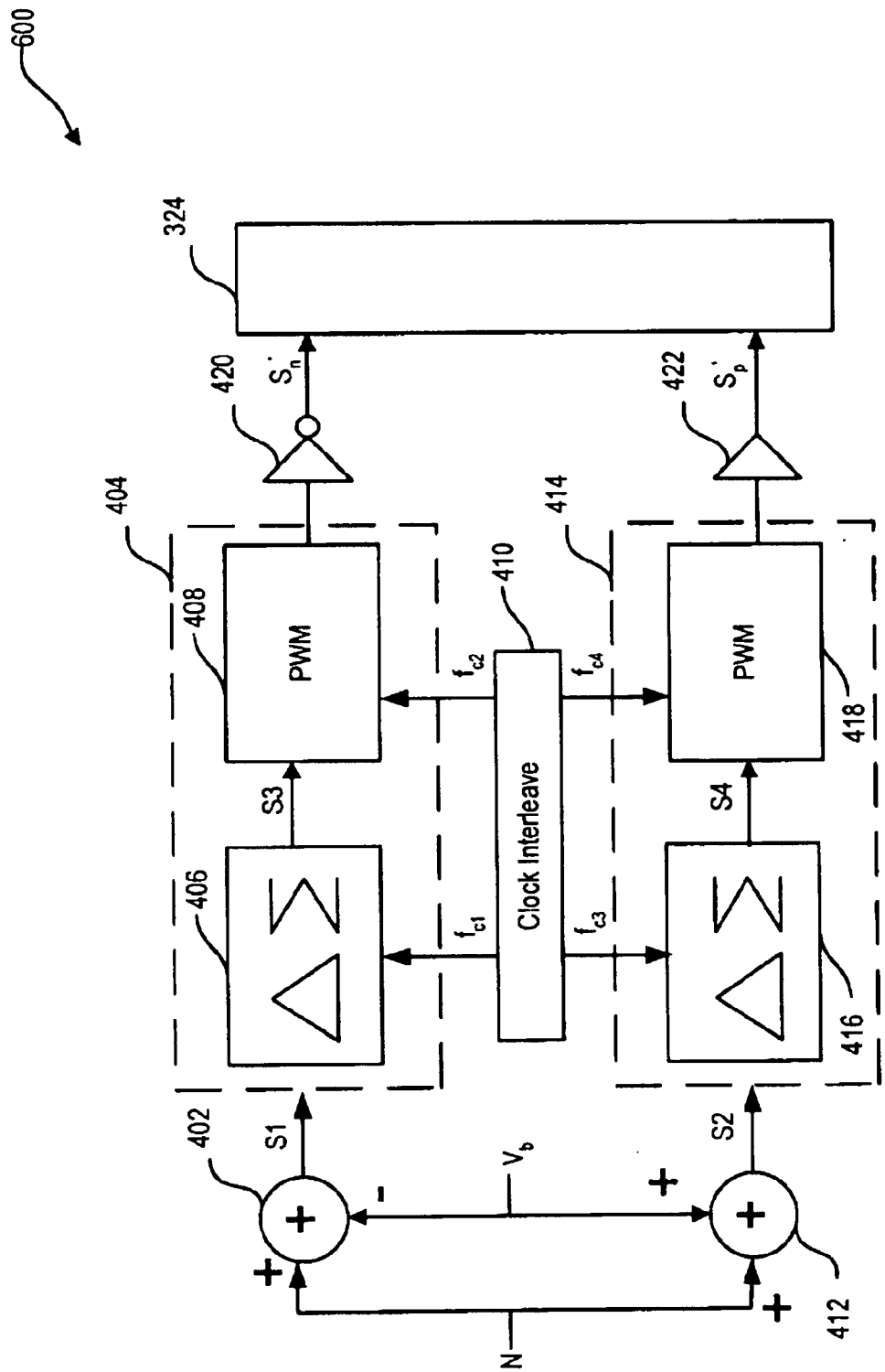
FIG. 6 depicts another embodiment of the digital signal processing system of FIG. 3 with clock interleave.

FIG. 6 depicts digital signal processing system 600, which is another embodiment of digital signal processing system 300. The digital signal processing system 600 represents one topology for implementing out-of-phase operation of digital signal modulators while maintaining the capability of processing input signal N to drive the four continuous current phases in accordance with Table 1.

The digital signal processing system 600 operates in a manner very similar to digital signal processing system 400. The primary differences involve the signals summed by summers 402 and 412, phase relationship between clock frequencies from clock 410, and the presence of an inverter 420 and delay 422. The net effect of these differences is to shift the periods of $S_n'$ and $S_p'$ 180 degrees and invert the output signals, $S_n$ and $S_p$, of digital signal modulators 404 and 414.

Summer 402 adds the complement of bias signal $V_b$ to signal N to generate signal S1. Summer 412 adds bias signal $V_b$ to signal N to generate respective signals S1 and S2. Signals S1 and S2 and signals S3 and S4 are processed by respective digital signal modulators 404 and 414 as discussed above. Digital signal modulator 404 produces output signal $S_n$, and digital signal modulator 414 produces output signal $S_p$. Inverter 420 inverts signal $S_n$, and delay element 422 delays signal $S_p$ to maintain the timing relationship between $S_n'$ and $S_p'$.

Although digital signal processing system 600 are used in many different applications, in one embodiment, it is used to modulate an audio signal. Accordingly, Table 3 sets forth exemplary sampling and clock frequencies useful for audio applications in conjunction with digital signal processing system 600.

TABLE 3

| Frequency Variable | Value | Phase |
|---|---|---|
| $f_s$ | 48 kHz | 0° |
| $f_{c1}$ | 384 kHz (i.e. 8 times $f_s$) | −180° |
| $f_{c2}$ | 49.152 MHz (i.e. $2^7$ times $f_{c1}$ for 7 bit resolution) | 0° |
| $f_{c3}$ | 384 kHz (i.e. 8 times $f_s$) | 0° |
| $f_{c4}$ | 49.152 MHz (i.e. 2 times $f_{c3}$ for 7 bit resolution) | 0° |

Figure 7A:
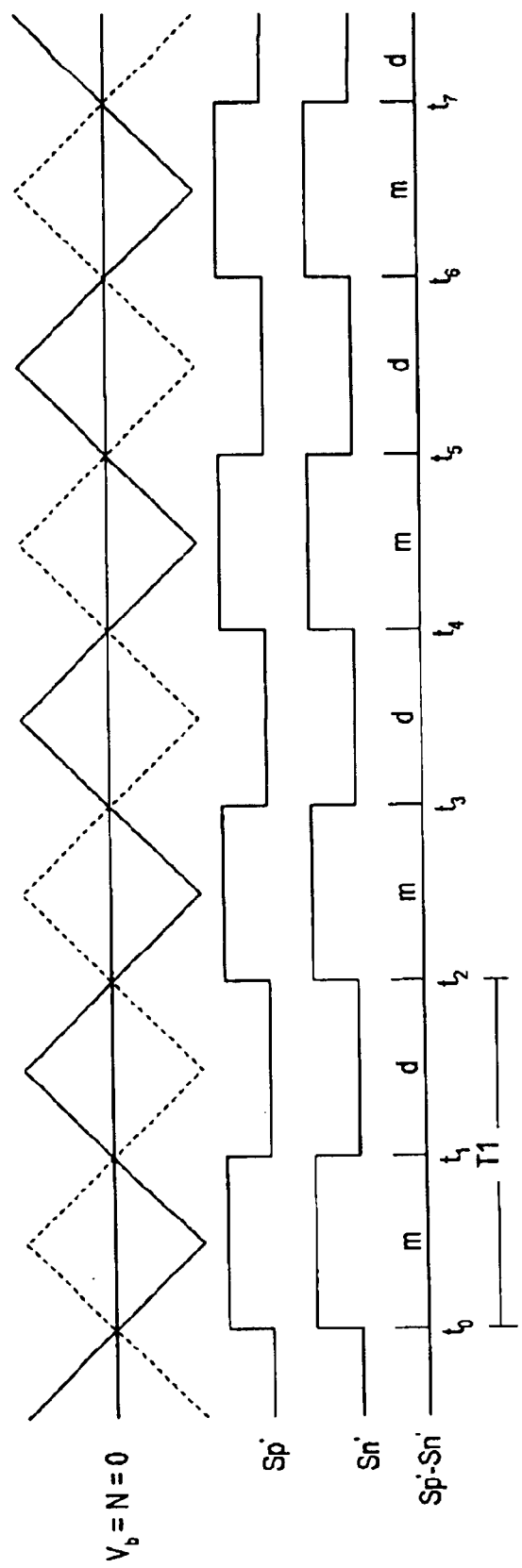
FIGS. 7A, 7B, and 7C depict examples of input and output signals from the digital signal processing system of FIG. 6 for various input signal levels.
Figure 7B:
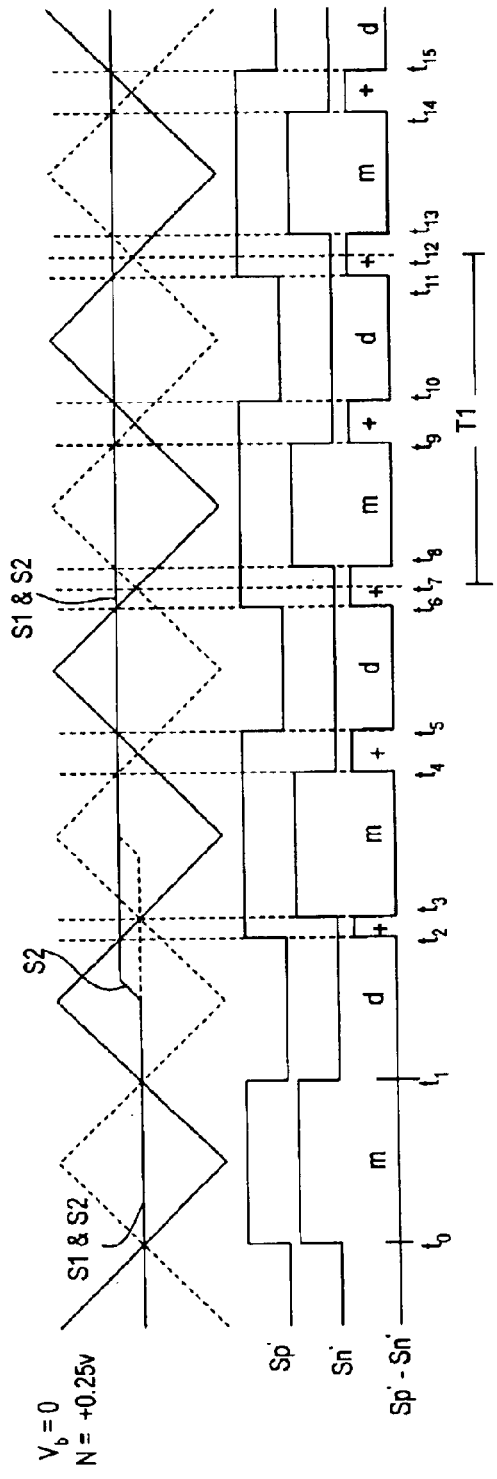
Figure 7C:
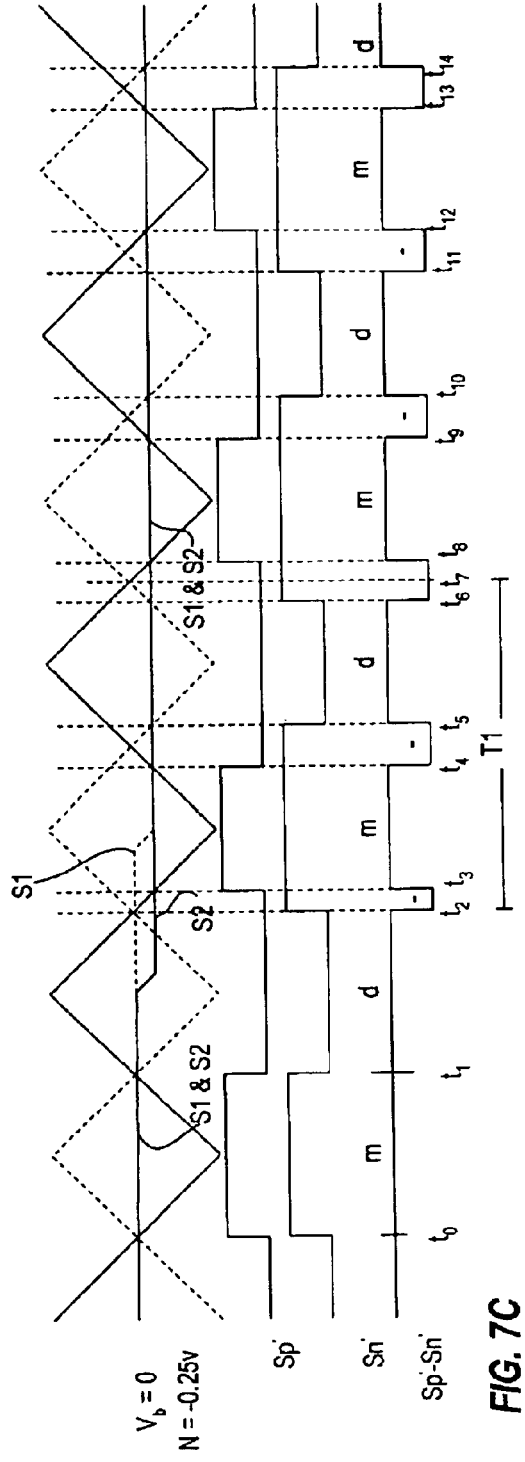

FIG. 7, consisting of FIGS. 7A, 7B, and 7C, depicts sample cycles of $S_p'$ and $S_n'$ as generated by digital signal processing system 600 in response to various levels of input signal N. Referring to FIG. 7A, the depiction of $S_p'$ minus $S_n'$ illustrates how digital signal processing system 600 processes a zero level input signal N and zero level bias signal $V_b$ to drive the four continuous current phases of power converter circuit 100 in accordance with Table 1. One period of PWMs 408 and 418 is represented by "T1." The time between t0 and t2 represents an example period T1 for T. During the first half of period T1, $S_p'$ and $S_n'$ are HIGH and are both LOW during the second half of period T1. Thus, assuming digital signal processing system 600 is driving power converter circuit 100, at node 106, Vout_average= Vsupply*((t1−t0)−(t2−t1))=0 for N=bias signal $V_b$=0. As depicted in FIG. 7A, Vout_average remains at 0 as long as N=bias signal $V_b$=0.

FIG. 7B illustrates the responsiveness of digital signal processing system 600 to positive changes in input signal N and concurrence with Table 1. Between t1 and t2, input signal S2 transitions with input signal N from 0 to +0.25 V, and input signal S1 follows signal S2 one-half period (−180°) later. The positive change in input signal N causes digital signal modulator 404 to generate $S_n'$ with a net LOW duty cycle during each period, while input signal N is positive and bias signal $V_b$=0. Correspondingly, digital signal modulator 414 generates $S_p'$ with a net HIGH duty cycle during each such period. For example, during period T1, $S_n'$ is LOW while $S_p'$ is HIGH for 0.625*T1, i.e. between t7 and t8, t9 and t10, and t11 and t12. During the remainder of T1 (i.e. 0.375*T1), $S_n'$ and $S_p'$ are both LOW. Thus, Vout_average for T1=Vsupply*(0.625−0.375)= 0.25*Vsupply. Thus, digital signal processing system 600 provides the appropriate levels of output signals $S_n'$ and $S_p'$ to drive load 324 to produce an output signal corresponding to the positive change in input signal N. Another pulse of the same duration as the net positive pulse between t2 and t3 will accompany a transition of input signal N from +0.25 to 0 V, which makes the total duty cycles of all periods for input signal N=+0.25 result in a Vout_average=0.25*Vsupply.

As a counterpart to FIG. 7B, FIG. 7C illustrates the responsiveness of digital signal processing system 600 to negative changes in input signal N and concurrence with Table 1. Between t1 and t2, input signal S2 transitions with input signal N from 0 to −0.25 V, and input signal S1 follows signal S2 one-half period (−180°) later. The negative change in input signal N causes digital signal modulator 404 to generate $S_n'$ with a net HIGH duty cycle during each period, while input signal N is negative and bias signal $V_b$=0. Correspondingly, digital signal modulator 414 generates $S_p'$ with a net LOW duty cycle during each such period. For example, during period T1, $S_n'$ is HIGH while $S_p'$ is LOW for 0.625*T1, i.e. between t2 and t3, t4 and t5, and t6 and t7. During the remainder of T1 (i.e. 0.375*T1), $S_n'$ and $S_p'$ are both HIGH. Thus, Vout_average for T1=Vsipply*(0.375− 0.625)=−0.25*Vsupply. Thus, digital signal processing system 600 provides the appropriate levels of output signals $S_n'$ and $S_p'$ to drive load 324 to produce an output signal corresponding to the negative change in input signal N.

Figure 8:
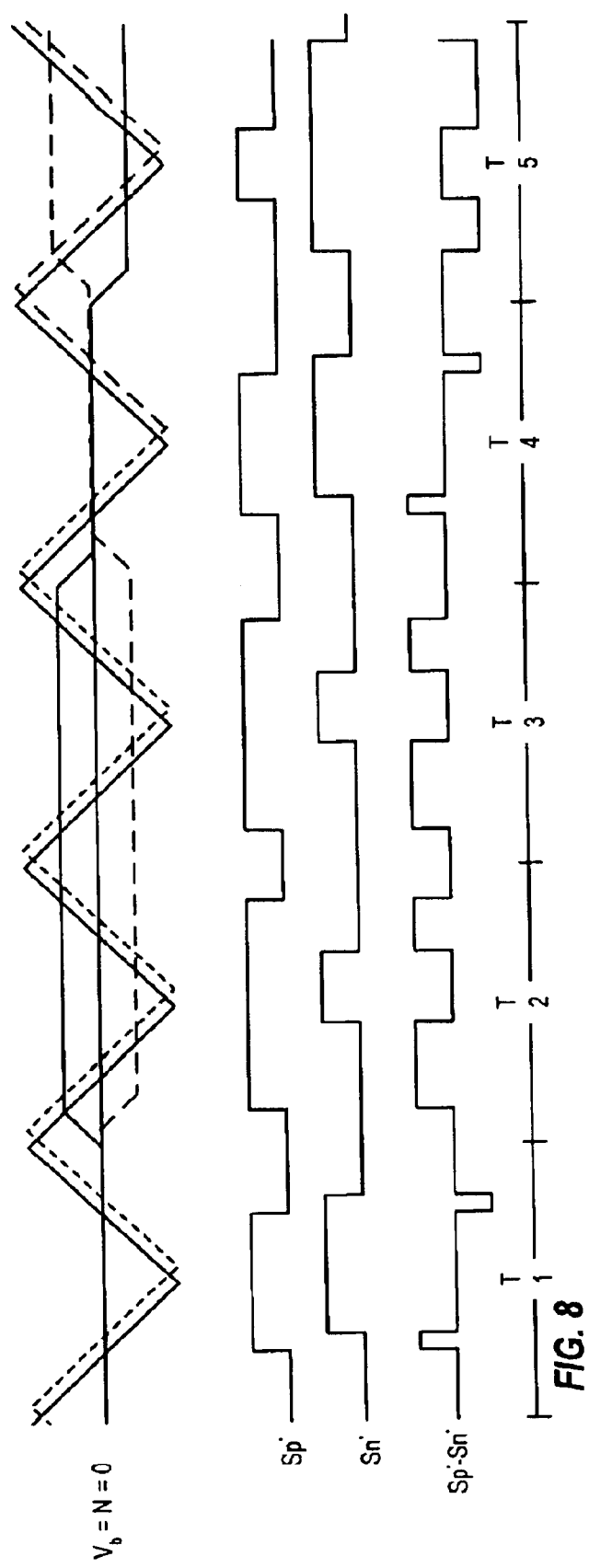
FIG. 8 depicts another example of input and output signals from the digital signal processing system of FIG. 4.

FIG. 8 further illustrates the ability of digital signal processing system 400 to successfully implement the four continuous current states of Table 1 using phase shifted clock frequencies. Signals $S_p'$ and $S_n'$ are generated by digital signal processing system 400 using the frequencies and phase relationships as set forth in Table 4.

TABLE 4

| Frequency Variable | Value | Phase |
|---|---|---|
| $f_s$ | 48 kHz | 0° |
| $f_{c1}$ | 384 kHz (i.e. 8 times $f_s$) | −22.5° |
| $f_{c2}$ | 49.152 MHz (i.e. $2^7$ times $f_{c1}$ for 7 bit resolution) | 0° |
| $f_{c3}$ | 384 kHz (i.e. 8 times $f_s$) | 0° |
| $f_{c4}$ | 49.152 MHz (i.e. $2^7$ times $f_{c3}$ for 7 bit resolution) | 0° |

In FIG. 8, bias signal $V_b$ equals zero, and input signal N transitions as follows: from 0 to +0.5 V in period T2, from +0.5 V to 0 in period T4, and from 0 to −0.5 V in period T5. Summing the negative and positive transitions of $S_p'−S_n'$ during period T1, T2, T3, T4, and T5 yields the values in Table 5 for Vout_average when driving power converter circuit 100 with digital signal processing system 400:

TABLE 5

| Period | Vout_average (volts) |
|---|---|
| T1 | 0 |
| T2 | +0.5 * Vsupply |
| T3 | +0.5 * Vsupply |
| T4 | 0 |
| T5 | −0.5 * Vsupply |

Vout average=0 for T1, Vout average=+0.50 for T2. Equivalent Vout averages are achieved regardless of the phase shift between the clock frequencies of digital signal modulators 404 and 414.

Figure 9:
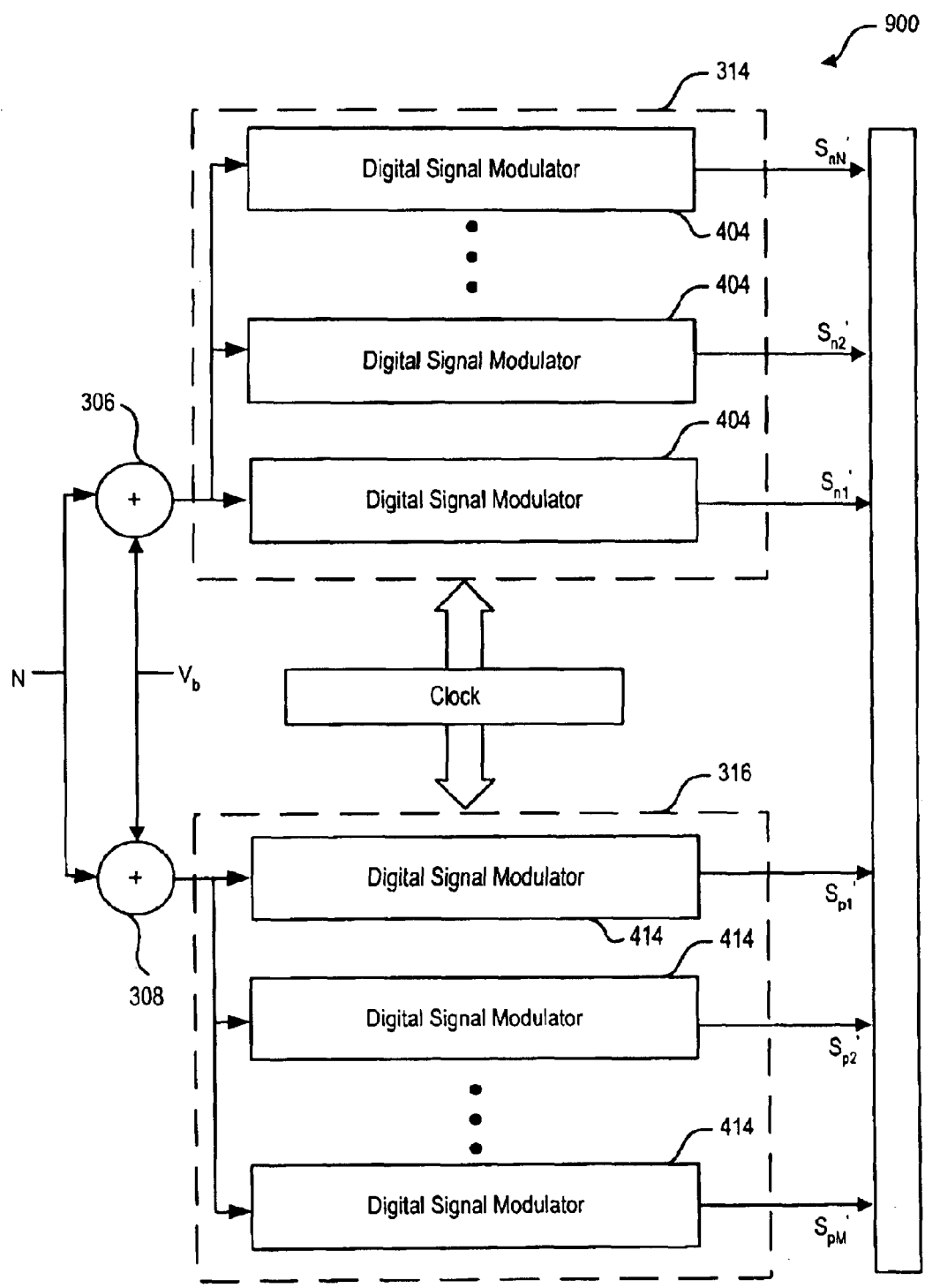
FIG. 9 depicts an embodiment of the digital signal processing system of FIG. 3 using N and M digital modulators, where N and M are integers greater than one.
Figure 10:
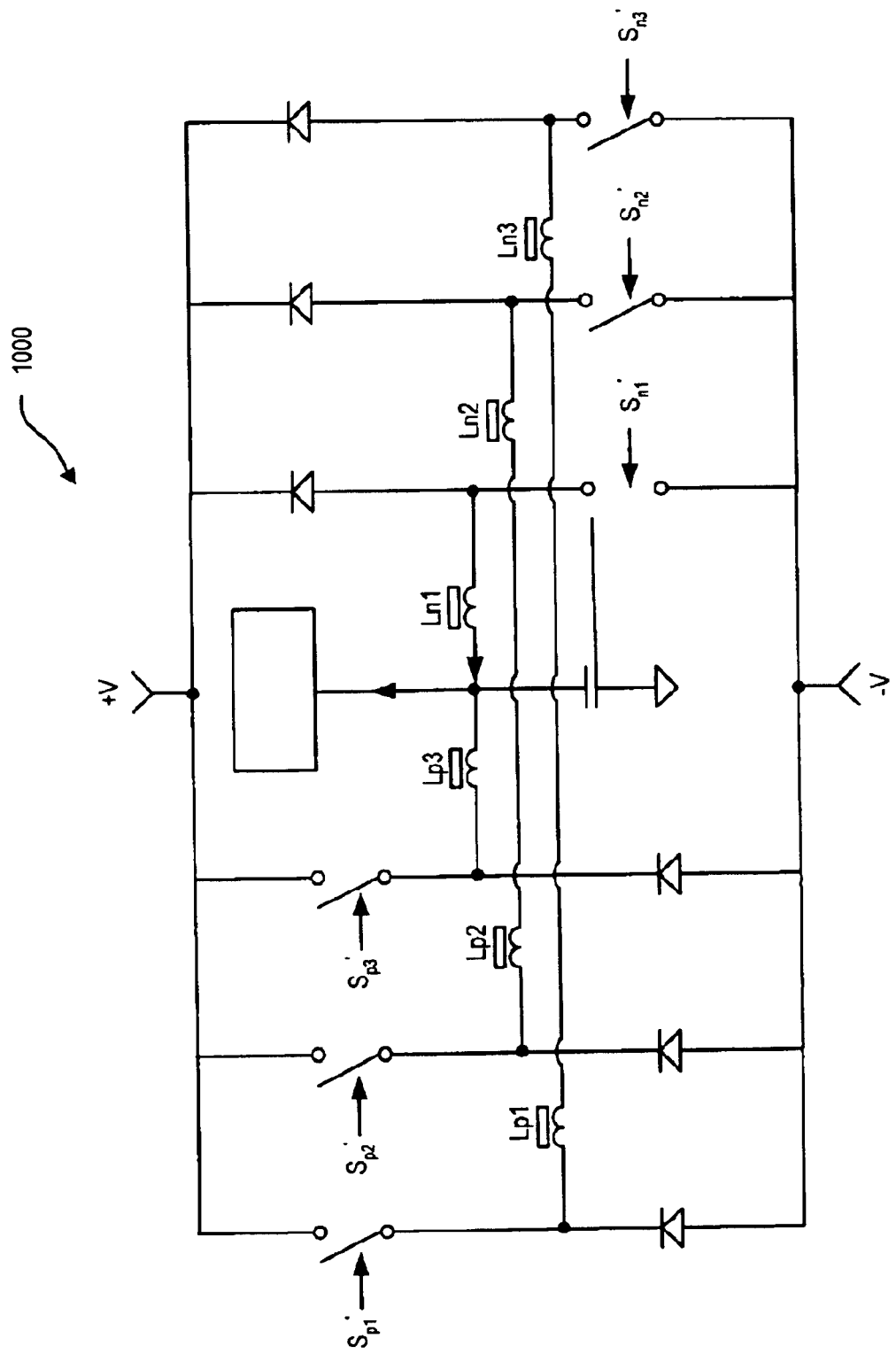
FIG. 10 depicts a three phase, half bridge opposed current amplifier for use with the digital signal processing system of FIG. 9.

FIG. 9 depicts digital signal processing system 900, which is an embodiment of the digital signal processing system 300. Digital signal processing system 900 uses N and M digital modulators, in which N and M are integers greater than one and are generally equal. The N and M digital modulators are each implemented using respective digital signal modulators 404 and 414. Thus, digital signal modulators 314 modulate input signal N into N output signals $S_{nN}'$, and digital signal modulators 316 modulate input signal N into M output signals $S_{pM}'$. For example, if N=M=3, the three digital modulators generating $S_{nM}'$ are clocked with frequencies 120° apart, the three digital modulators generating $S_{nN}'$ are clocked with frequencies 120° apart, and the clocks for M=N are in-phase. Digital signal processing system 900 then drives a three phase OCC 1000 as illustrated in FIG. 10. This setup further reduces the ripple current in the load and decreases the sensitivity to clock jitter.

Figure 11:
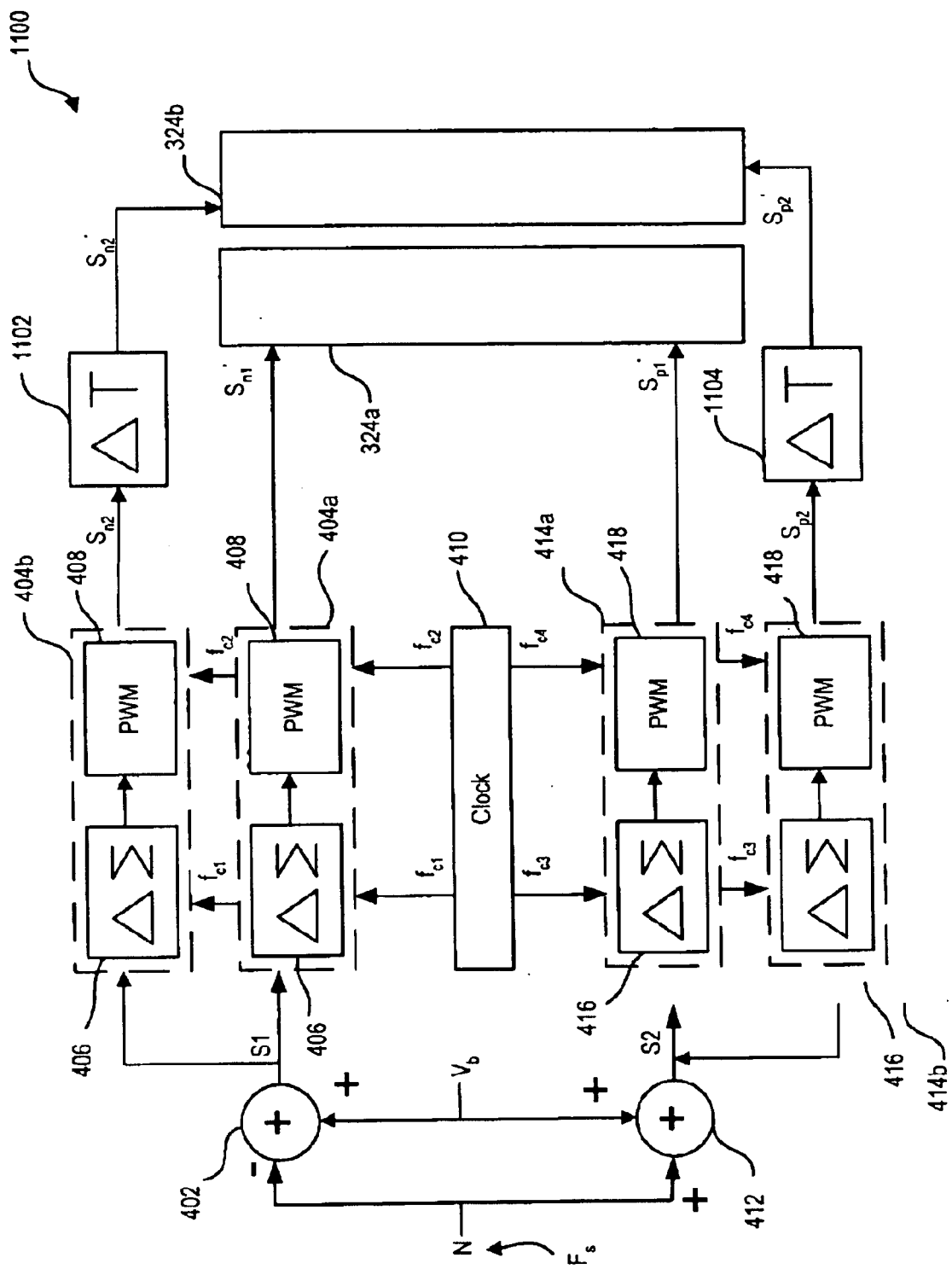
FIG. 11 depicts an embodiment of the digital signal processing system of FIG. 3 using two pairs of digital modulators and signal delay elements.

FIG. 11 depicts digital signal processing system 1100, which is another embodiment of digital signal processing system 300. Digital signal processing system 1100 utilizes two pairs of digital signal modulators 404 and 414 with the respective pairs designated using "a" and "b" trailing identifiers. Digital signal modulators 404a and 414a operate in the same manner as digital signal modulators 404 and 414 to provide output signals $S_n'$ and $S_p'$ to drive load 324a as described with respect to FIG. 4. Digital signal modulators 404b and 414b also operate in the same manner as digital signal modulators 404 and 414 to provide output signals $S_{n2}$ and $S_{p2}$. However, output signals $S_{n2}$ and $S_{p2}$ are delayed by respective delay elements 1102 and 1104. Delay elements 1102 and 1104 operateas the delay elements described in the Anderskouv-Risbo Patent to reduce cross-over distortion between loads 324a and 324b in the audio frequency band. Loads 324a and 324b are, for example, embodiments of power converter circuit 100.

Thus, a digital input signal is modulated using multiple digital signal modulators operating at a variety of clock frequencies and clock frequency phase relationships to drive a load, such as an OCC.

The signal processing systems disclosed herein may be manufactured using well-known integrated, discrete, or a combination of integrated and discrete components. Those of ordinary skill in the art will recognize that the signal processing systems disclosed herein may be implemented with a wide range of components other than those disclosed herein. For example, the digital signal modulators could be implemented using mixed signal (analog and digital) technology.

Although the present invention has been described in detail, it should be understood that various changes, substitutions and alterations may be made hereto without departing from the spirit and scope of the invention as defined by the appended claims. For example, application of the signal processing systems described herein are not limited to audio applications.

What is claimed is:

1. An apparatus, comprising:
   a first digital signal modulator to generate a first output signal derived from a digital input signal;
   a second digital signal modulator to generate a second output signal derived from the digital input signal; and
   wherein, during operation of the first and second digital signal modulators, the first output signal has a direct relationship to change in the digital input signal, the second output signal has an inverse relationship to change in the digital input signal, and the first and second output signals are suitable for driving an opposed current converter stage.

2. The apparatus of claim 1 further comprising:
   a first summer to sum a first bias signal and the digital input signal and to provide the sum to the first digital signal modulator; and
   a second summer to sum a second bias signal and the digital input signal and to provide the sum to the second digital signal modulator.

3. The apparatus of claim 2, wherein the first and second bias signals are arithmetic complements of equal magnitude.

4. The apparatus of claim 2, wherein the first and second bias signals are identical.

5. The apparatus of claim 2, wherein the first and second output signals are approximately equal duty cycles when the digital signals modulated by the first and second digital signal modulators are equal.

6. The apparatus of claim 5, further comprising:
   a third digital signal modulator to generate a third output signal derived from the digital input signal;
   a fourth digital signal modulator to generate a fourth output signal derived from the digital input signal, wherein the third output signal has a direct relationship to change in the digital input signal and the fourth output signal has an inverse relationship to change in the digital input signal;
   a first amplifier having a first switch, coupled between a first voltage source and a load, with a control terminal to receive the first output signal and having a second switch, coupled between a second voltage source and the load, with a control terminal to receive the second output signal; and
   a second amplifier having a first switch, coupled between the first voltage source and the load, with a control terminal to receive the third output signal and having a second switch, coupled between the second voltage source and the load, with a control terminal to receive the fourth output signal.

7. The apparatus of claim 1, wherein the first digital signal modulator further includes a delay element to delay an output signal of the first digital signal modulator relative to an output signal of the second signal modulator.

8. The apparatus of claim 1 wherein:
   the first output signal is operable to control a first switch;
   the second output signal is operable to control a second switch; and
   a duty cycle of the first switch has an inverse relationship to a duty cycle of the second switch if the digital input signal has a non-zero magnitude.

9. The apparatus of claim 8, wherein the change in the digital input signal comprises a change in magnitude of the digital input signal.

10. The apparatus of claim 1, further comprising:
an analog output stage coupled to the first and second modulators and having (i) respective inputs to receive the first and second output drive signals, and (ii) circuitry to convert the first and second output drive signals into a single analog output signal.

11. The apparatus of claim 10, wherein the analog output stage comprises an opposed current power converter circuit, the opposed current power converter circuit comprising:
a positive current control switch coupled to the first modulator output;
a negative current control switch coupled to the second modulator output; and
an output terminal coupled between the positive current control switch and the negative current control switch for supplying current to a load.

12. The apparatus of claim 1, wherein:
the first modulator comprises:
a first delta-sigma modulator to receive and process the first digital input signal;
a first duty cycle demodulator, coupled to the first delta-sigma modulator, to provide the first output signal;
the second modulator comprises:
a second delta-sigma modulator to receive and process the second digital input signal; and
a second duty cycle demodulator, coupled to the second delta-sigma modulator, to provide the second output signal.

13. The apparatus as in claim 12, wherein the first and second duty cycle demodulators include respective first and second pulse width modulators, respectively.

14. The apparatus of claim 1, wherein the first and second modulators include noise-shaping capabilities to reduce audio frequency noise.

15. The apparatus of claim 1 further comprising:
a clock to provide interleaved clock signals to the first and second modulators.

16. The apparatus of claim 1, wherein one of the output signals is delayed in time with respect to the other output signal so that transitions of the first and second output drive signal occur at different times.

17. The apparatus of claim 1, wherein the digital input signal is an audio signal.

18. The apparatus of claim 1 further comprising:
N additional modulators, each having an input to receive the first digital input signal and an output to provide an output drive signal; and
M additional modulators, each having an input to receive the second digital input signal and an output to provide an output drive signal;
wherein N and M are positive integers.

19. The apparatus of claim 1, wherein the apparatus comprises a digital signal processing system.

20. A signal processing system having multiple digital to analog converters and an analog output stage to generate a drive signal, the signal processing system comprising:
a first modulator having an input to receive a first digital input signal derived from a common input signal and a first bias signal and an output to provide a first modulated output signal;
a second modulator having an input to receive a second digital input signal derived from the common input signal and a second bias signal and an output to provide a second modulated output signal; and
an analog output stage coupled to the first and second modulators and having a first input to receive the first modulated output signal, a second input to receive the second modulated output signal, circuitry to convert the first and second output signals into a drive signal, and an output to provide current to a load.

21. The digital to analog converter system of claim 20, further comprising:
a first summer, coupled to the first modulator, comprising:
respective inputs to receive the common input signal and the second bias signal;
circuitry to sum the common input signal and the second bias signal into the second digital input signal; and
an output to provide the second digital input signal to the second modulator; and
a second summer, coupled to the second modulator,
respective inputs to receive the common input signal and the second bias signal;
circuitry to sum the common input signal and the second bias signal into the second digital input signal; and
an output to provide the second digital input signal to the second modulator.

22. The digital to analog converter system of claim 20, wherein the first and second bias input signals are arithmetic complements of equal magnitude, the system further comprising:
an inverter coupled between the output of the second modulator and the second input of the analog output stage.

23. The digital to analog converter system of claim 20, wherein:
the first modulator includes a first stage delta-sigma modulator and a second stage duty cycle demodulator; and
the second modulator includes a first stage delta-sigma modulator and a second stage duty cycle demodulator.

24. The digital to analog converter system of claim 23, wherein respective duty cycles of the first and second output signals control current to the load.

25. The digital to analog converter system of claim 20, wherein the first and second digital output signals are out-of-phase.

26. The digital to analog converter system of claim 20, wherein the analog output stage is an opposed current power converter circuit.

27. The digital to analog converter system of claim 20 further comprising:
N modulators coupled to the first summer and each having an input to receive the first digital output signal and an output to provide an output signal; and
M modulators coupled to the second summer and each having an input to receive the second digital output signal and an output to provide an output signal;
wherein N and M are positive integers.

28. The digital to analog converter system of claim 20, wherein the first and second bias signals are arithmetic complements.

29. An apparatus, comprising:
means for generating a first digital input signal from a common input signal and a first bias signal;
means for modulating the first digital input signal, coupled to the means for generating the first digital input signal, to generate N modulated output signal(s), wherein N is a positive integer;

means for generating a second digital input signal from the common input signal and a second bias signal;

means for modulating the second digital input signal, coupled to the means for generating the first digital input signal, to generate M modulated output signal(s), wherein M is a positive integer; and means for converting the N and M modulated output signals into a drive signal.

30. The apparatus of claim 29, wherein the means for converting comprises an opposed current converter.

31. A method of providing multiple output drive signals derived from a common input signal using multiple modulators, the method comprising:

receiving a first digital input signal, the first digital input signal being derived from a common input signal and a first bias signal;

converting the first digital input signal into a first output signal using a first modulator;

receiving a second digital input signal, the second digital input signal being derived from the common input signal and a second bias signal;

converting the second digital input signal into a second output signal using a second modulator; and providing the first and second output signal to circuitry operable to derive a drive signal from the first and second output signals.

32. The method of claim 31, wherein:

converting the first digital input signal comprises:
modulating the first digital input signal with a first delta-sigma modulator to generate a first delta-sigma output signal; and
modulating the first delta-sigma output signal with a first pulse width modulator to generate the first output signal; and converting the second digital input signal comprises:
modulating the second digital input signal with a second delta-sigma modulator to generate a second delta-sigma output signal; and
modulating the second delta-sigma output signal with a second pulse width modulator to generate the second output signal.

33. The method of claim 31, further comprising:

utilizing the first and second output signals to cause an opposed current converter to provide the drive signal as an output signal.

34. The method of claim 31, wherein the first and second output signals are approximately in-phase when the first digital input signal and the second digital input signal are equal.

35. The method of claim 31 further comprising:

adding the common input signal and the first bias signal to derive the first digital input signal;

subtracting the second bias signal from the common input signal to derive the second digital input signal; and inverting an output signal of the second modulator.

36. The method of claim 31, further comprising:

subtracting the common input signal from the first bias signal to derive the first digital input signal; and adding the common input signal and the second bias signal to derive the second digital input signal.

37. The method of claim 31, further comprising:

converting the first digital input signal into N additional output signals using N modulators, wherein N is a positive integer;

converting the second digital input signal into M additional output signals using M modulators, wherein M is a positive integer; and converting the first and second output signals and the N and M additional output signals into the single drive signal.

38. A method of providing multiple output signals derived from a common digital input signal using multiple modulators, the method comprising:

generating a first output signal derived from the digital input signal using a first digital signal modulator; and generating a second output signal derived from the digital input signal using a second digital signal modulator, wherein the first output signal has a direct relationship to change in the digital input signal and the second output signal has an inverse relationship to change in the digital input signal.

39. The method of claim 38, wherein:

generating the first digital input signal comprises:
modulating the first digital input signal with a first delta-sigma modulator to generate a first delta-sigma output signal; and
modulating the first delta-sigma output signal with a first pulse width modulator to generate the first output signal; and generating the second digital input signal comprises:
modulating the second digital input signal with a second delta-sigma modulator to generate a second delta-sigma output signal; and
modulating the second delta-sigma output signal with a second pulse width modulator to generate the second output signal.

\* \* \* \* \*